US011276776B2

(12) United States Patent
Hoshi (10) Patent No.: US 11,276,776 B2
(45) Date of Patent: Mar. 15, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/105,904

(22) Filed: Nov. 27, 2020

(65) Prior Publication Data

US 2021/0083105 A1 Mar. 18, 2021

Related U.S. Application Data

(63) Continuation of application No. PCT/JP2019/043517, filed on Nov. 6, 2019.

(30) Foreign Application Priority Data

Dec. 21, 2018 (JP) .............................. JP2018-240372

(51) Int. Cl.
*H01L 29/78* (2006.01)
*H01L 29/16* (2006.01)
*H01L 29/66* (2006.01)

(52) U.S. Cl.
CPC ...... *H01L 29/7815* (2013.01); *H01L 29/1608* (2013.01); *H01L 29/66734* (2013.01); *H01L 29/7803* (2013.01); *H01L 29/7813* (2013.01)

(58) Field of Classification Search
CPC ............... H01L 29/7815; H01L 7/1608; H01L 7/66734; H01L 7/7803; H01L 7/7813
(Continued)

(56) References Cited

U.S. PATENT DOCUMENTS 5,821,580 A * 10/1998 Kuwahara ........... H01L 29/7813
257/330
6,060,744 A * 5/2000 Kuwahara ........... H01L 29/7815
257/328
(Continued)

FOREIGN PATENT DOCUMENTS

JP H10-132871 A 5/1998
JP 2000-252468 A 9/2000
(Continued)

OTHER PUBLICATIONS

International Search Report for PCT/JP2019/043517, dated Jan. 28, 2020.
(Continued)

*Primary Examiner* — Igwe U Anya
(74) *Attorney, Agent, or Firm* — Rabin & Berdo, P.C.

(57) ABSTRACT

A semiconductor device having a metal oxide semiconductor that includes a semiconductor substrate, a first semiconductor layer provided on a the semiconductor substrate, a plurality of second semiconductor layers selectively provided on the first semiconductor layer, a plurality of first semiconductor regions selectively provided in the second semiconductor layers at a surface thereof, a plurality of gate insulating films with a plurality of gate electrodes provided thereon, a plurality of first electrodes provided on the second semiconductor layers and the first semiconductor regions, and a second electrode provided on a back surface of the semiconductor substrate. The MOS structure configures an active region and a current detecting region of the semiconductor device. The semiconductor substrate and the first semiconductor layer are in both the active region and the current detecting region. Two of the second semiconductor layers, respectively in the current detecting region and the (Continued)

active region, are separated from each other by a predetermined distance.

5 Claims, 9 Drawing Sheets

(58) Field of Classification Search
USPC .......................................................... 257/288
See application file for complete search history.

(56) References Cited

U.S. PATENT DOCUMENTS

| | | |
|---|---|---|
| 6,351,009 B1 | 2/2002 | Kocon et al. |
| 2014/0084361 A1* | 3/2014 | Saito ................... H01L 29/0878 |
| | | 257/329 |
| 2018/0047721 A1* | 2/2018 | Nishimura .......... H01L 29/4236 |
| 2018/0047722 A1* | 2/2018 | Nishimura .......... H01L 27/0629 |
| 2018/0182885 A1 | 6/2018 | Kobayashi |
| 2019/0123195 A1 | 4/2019 | Suekawa |

FOREIGN PATENT DOCUMENTS

| | | |
|---|---|---|
| JP | 2018-107168 A | 7/2018 |
| WO | 2017/002255 A1 | 1/2017 |

OTHER PUBLICATIONS

Written Opinion of the International Searching Authority for PCT/JP2019/043517, dated Jan. 28, 2020.

* cited by examiner

SEMICONDUCTOR DEVICE AND METHOD OF MANUFACTURING SEMICONDUCTOR DEVICE

CROSS REFERENCE TO RELATED APPLICATION

This is a continuation application of International Application PCT/JP2019/043517 filed on Nov. 6, 2019 which claims priority from a Japanese Patent Application No. 2018-240372 filed on Dec. 21, 2018, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices In such a high-voltage semiconductor device that uses silicon carbide, to the extent that switching loss occurring with ON/OFF operation is reduced, a carrier frequency ten times that of a conventional semiconductor device that uses silicon may be applied in inverter applications. When a semiconductor device is used for high frequency applications, the chip is subjected to high temperatures due to generated heat, thereby affecting the reliability of the semiconductor device. In particular, when a bonding wire is bonded to a front electrode on a front side of a substrate as a wiring material that leads out potential of the front electrode externally and the semiconductor device is used at a temperature of, for example, at least 200 degrees C., adhesion between the front electrode and the bonding wire decreases, thereby affecting reliability.

Silicon carbide semiconductor devices may be used at high temperatures of at least 230 degrees C. and therefore, in some instances, instead of the bonding wire, a pin-shaped external terminal electrode is bonded by solder to the front electrode. As a result, decreases in the adhesion between the front electrode and the external terminal electrode may be prevented.

Further, to enhance reliability of a silicon carbide semiconductor device, a device has been proposed in which on a single semiconductor substrate having a vertical MOSFET that is a main semiconductor element, a high-function structure is necessary in which high-functioning regions such as a current sensing region, a temperature sensing region, and an over-voltage protecting region are disposed. In an instance of the high-function structure, to stably form the high-functioning regions, in an active region, a region in which only high-functioning regions are disposed is provided separate from the unit cells of the main semiconductor element and adjacent to an edge termination region. The active region is a region through which a main current flows when the main semiconductor element is ON. The edge termination region is a region for mitigating electric field at a front side of the semiconductor substrate and sustaining a breakdown voltage (withstand voltage). The breakdown voltage is a voltage limit at which no erroneous operation or destruction of an element occurs.

An external terminal electrode for detecting current is provided in the current sensing region. In current detection, an external resistor is connected between the external terminal electrode for detecting current and a source electrode of the active region, and a difference in potential with respect to the external resistor is detected to obtain a current value.

According to a commonly known technique, in a silicon carbide semiconductor device having a current sensing region, an arithmetic area of contact between a current detecting electrode of the current sensing region and a source region is larger than an arithmetic area of contact between the current detecting electrode of the current sensing region and a base region to enable current to be detected even with high detection voltage (for example, refer to Japanese Laid-Open Patent Publication No. H10-132871).

SUMMARY OF THE INVENTION

According to an embodiment of the invention, a semiconductor device has an active region through which a main current flows and a current detecting region. The semiconductor device includes a metal oxide semiconductor (MOS) structure having: a semiconductor substrate of a first conductivity type, having opposite front and back surfaces; a first semiconductor layer of the first conductivity type, provided on the front surface of the semiconductor substrate and having an impurity concentration lower than an impurity concentration of the semiconductor substrate, the first semiconductor layer having opposite first and second surfaces, the first surface thereof facing the semiconductor substrate; a plurality of second semiconductor layers of a second conductivity type, selectively provided on the second surface of the first semiconductor layer, each of the second semiconductor layers having opposite first and second surfaces, the first surface thereof facing the semiconductor substrate; a plurality of first semiconductor regions of the first conductivity type, selectively provided in the second semiconductor layers at the second surfaces thereof; a plurality of gate insulating films, each having opposite first and second surfaces, the first surface thereof being in contact with one of the second semiconductor layers; a plurality of gate electrodes provided on the second surfaces of the gate insulating films; a plurality of first electrodes provided on the second surfaces of the second semiconductor layers and surfaces of the first semiconductor regions; and a second electrode provided on the back surface of the semiconductor substrate. The MOS structure configures the active region and the current detecting region. The semiconductor substrate and the first semiconductor layer are in both the active region and the current detecting region, and two of the plurality of the second semiconductor layers are respectively formed in the current detecting region and the active region, and are separated from each other by a predetermined distance, an arithmetic area of the second surface of the second semiconductor layer in the current detecting region being smaller than an arithmetic area of the second surface of the second semiconductor layer in the active region.

In the embodiment, the arithmetic area of the second surface of the second semiconductor layer in the current detecting region is at most ½ of the arithmetic area of the second surface of the second semiconductor layer in the active region.

In the embodiment, the MOS structure further has a plurality of trenches penetrating the first semiconductor regions and the second semiconductor layers, and reaching the first semiconductor layer, and the gate electrodes are provided in the trenches via the gate insulating films, respectively.

In the embodiment, the MOS structure further has a plurality of second semiconductor regions of the second conductivity type, selectively provided in the second semiconductor layers at the second surfaces thereof, the second semiconductor regions having an impurity concentration higher that an impurity concentration of the second semiconductor layers. The first semiconductor regions and the second semiconductor regions are alternately provided along a length direction of the trenches that is in parallel to the second surfaces of the second semiconductor layers, a length of each of the first semiconductor regions in the current detecting region, along the length direction, being greater than a length of each of the second semiconductor regions in the current detecting region, in the length direction.

According to another embodiment, a method of manufacturing a semiconductor device having a metal oxide semiconductor (MOS) structure in a current detecting region and in an active region thereof, a main current flowing through the active region in an ON state of the semiconductor device, the method includes preparing a semiconductor substrate of a first conductivity type, having opposite front and back surfaces; forming a first semiconductor layer of the first conductivity type on the front surface of the semiconductor substrate, the first semiconductor layer having an impurity concentration lower than an impurity concentration of the semiconductor substrate, the first semiconductor layer having opposite first and second surfaces, the first surface thereof facing the semiconductor substrate; selectively forming a plurality of second semiconductor layers of a second conductivity type, on the second surface of the first semiconductor layer, each of the second semiconductor layers having opposite first and second surfaces, the first surface thereof facing the semiconductor substrate; selectively forming a plurality of first semiconductor regions of the first conductivity type, respectively in the second semiconductor layers at the second surfaces thereof; forming a plurality of gate insulating films each having opposite first and second surfaces, the first surface thereof being in contact with one of the second semiconductor layers; forming a plurality of gate electrodes on the second surfaces of the gate insulating films; forming a plurality of first electrodes on the second surfaces of the second semiconductor layers and surfaces of the first semiconductor regions; and forming a second electrode on the back surface of the semiconductor substrate. The semiconductor substrate and the first semiconductor layer are formed in both the current detecting region and the active region. Two of the plurality of the second semiconductor layers are respectively formed in the current detecting region and the active region, and are separated from each other by a predetermined distance, an arithmetic area of the second surface of the second semiconductor layer in the current detecting region being smaller than an arithmetic area of the second surface of the second semiconductor layer in the active region.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be described. Even in high-functioning regions including a current sensing region, a temperature sensing region, etc., a built-in diode configured by an n-type semiconductor substrate and a p-type semiconductor region is formed functioning as a diode, whereby current is energized. In particular, the current sensing region is designed to have an arithmetic area that is at most 1/1000 relative to the active region and the p-type semiconductor region is formed so as to surround a functional region of the current sensing region. In such a configuration, in a periphery of the current sensing region, an excess p-type region occurs, an effective arithmetic area as a built-in diode is at least equal to an arithmetic area of the current sensing region, and during reverse recovery of the built-in diode, excess carriers concentrate. At this time, due to the excess carriers and dv/dt, the current sensing region may be destroyed.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index.

A semiconductor device according to the invention is configured using a wide bandgap semiconductor. In an embodiment, a silicon carbide semiconductor device fabricated using, for example, silicon carbide (SiC) as a wide bandgap semiconductor will be described taking a MOSFET as an example.

Figure 1:
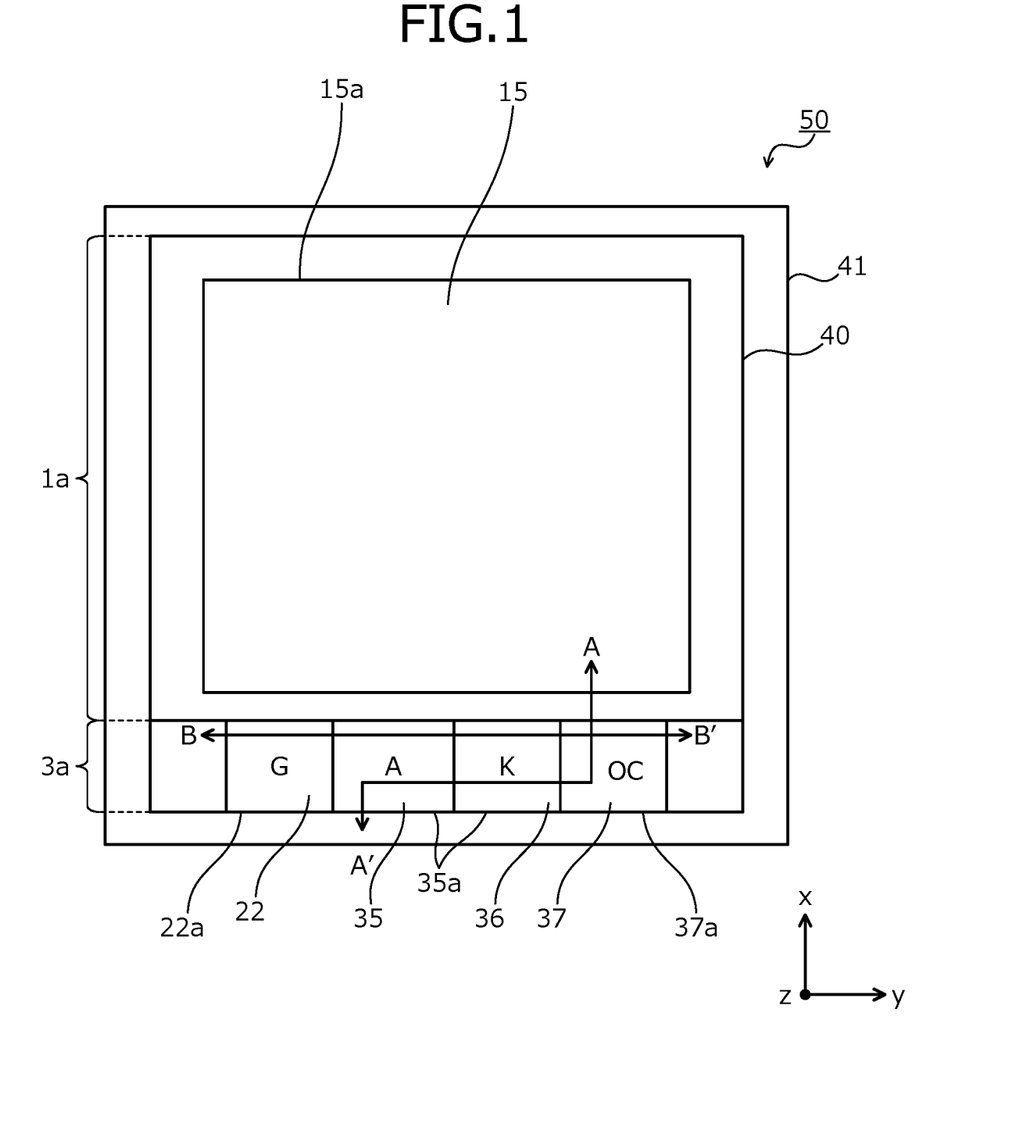
FIG. 1 is a top view of a structure of a silicon carbide semiconductor device according to an embodiment.

FIG. 1 is a top view of a structure of a silicon carbide semiconductor device according to an embodiment. As depicted in FIG. 1, in a silicon carbide semiconductor device 50, at an outer periphery of an active region 40 through which a main current flows, an edge termination region 41 that sustains a breakdown voltage is provided surrounding a periphery of the active region 40.

As depicted in FIG. 1, the silicon carbide semiconductor device 50 has, on a single semiconductor substrate containing silicon carbide, a main semiconductor element 15a and high-functioning regions such as, for example, a current sensing region (current detecting region) 37a, a temperature sensing region 35a, an over-voltage protecting region (not depicted), and arithmetic circuit region (not depicted) as a circuit region for protecting and controlling the main semiconductor element 15a. The main semiconductor element 15a is a vertical MOSFET in which drift current flows in a vertical direction (a depth direction z of the semiconductor substrate) when in an ON state; the main semiconductor element 15a performs a main operation and is configured by multiple unit cells (functional units, not depicted) disposed adjacent to one another.

The main semiconductor element 15a is provided in an effective region (region functioning as MOS gates) 1a of the active region 40. The effective region 1a of the active region 40 is a region through which the main current flows when the main semiconductor element 15a is ON; a periphery of the effective region 1a is surrounded by the edge termination region 41. In the effective region 1a of the active region 40, a source electrode pad 15 of the main semiconductor element 15a is provided on a front surface of the semiconductor substrate. The source electrode pad 15, for example, has a rectangular planar shape and, for example, covers substantially an entire area of the effective region 1a of the active region 40.

The edge termination region 41 is a region between the active region 40 and chip side-surfaces, and is a region for mitigating electric field on a front side of the semiconductor substrate and sustaining a breakdown voltage (withstand voltage). In the edge termination region 41, for example, a voltage withstanding structure (not depicted) such as a field plate or RESURF, a p-type region configuring a guard ring or a junction termination extension (JTE) structure, etc. is disposed. The breakdown voltage is a voltage limit at which no erroneous operation or destruction of an element occurs.

Further, in the active region 40, a high-function region 3a is provided adjacent to the edge termination region 41. The high-function region 3a, for example, has a substantially rectangular planar shape. In the high-function region 3a, high-functioning regions such as the current sensing region 37a, the temperature sensing region 35a, the over-voltage protecting region (not depicted), and the arithmetic circuit region (not depicted) are provided. In FIG. 1, while the current sensing region 37a and the temperature sensing region 35a are depicted as high-functioning regions, high-functioning regions other than the current sensing region 37a and the temperature sensing region 35a may be disposed in the high-function region 3a.

The current sensing region 37a has a function of detecting over-current (OC) flowing in the main semiconductor element 15a. The current sensing region 37a is a vertical MOSFET that includes a few unit cells configured similarly to those of the main semiconductor element 15a. The temperature sensing region 35a has a function of detecting the temperature of the main semiconductor element 15a, using diode temperature characteristics. The over-voltage protecting region, for example, is a diode that protects the main semiconductor element 15a from over-voltage (OV) such as surges.

Further, in the high-function region 3a, on the front surface of the semiconductor substrate, an OC pad 37 of the current sensing region 37a, an anode electrode pad 35 and a cathode electrode pad 36 of the temperature sensing region 35a, and a gate electrode pad 22 of a gate electrode pad region 22a are provided along a border between the active region 40 and the edge termination region 41, separate from the source electrode pad 15 and the edge termination region 41. Each of these electrode pads, for example, has a substantially rectangular planar shape. Further, these electrode pads may be provided separate from one another.

Figure 2:
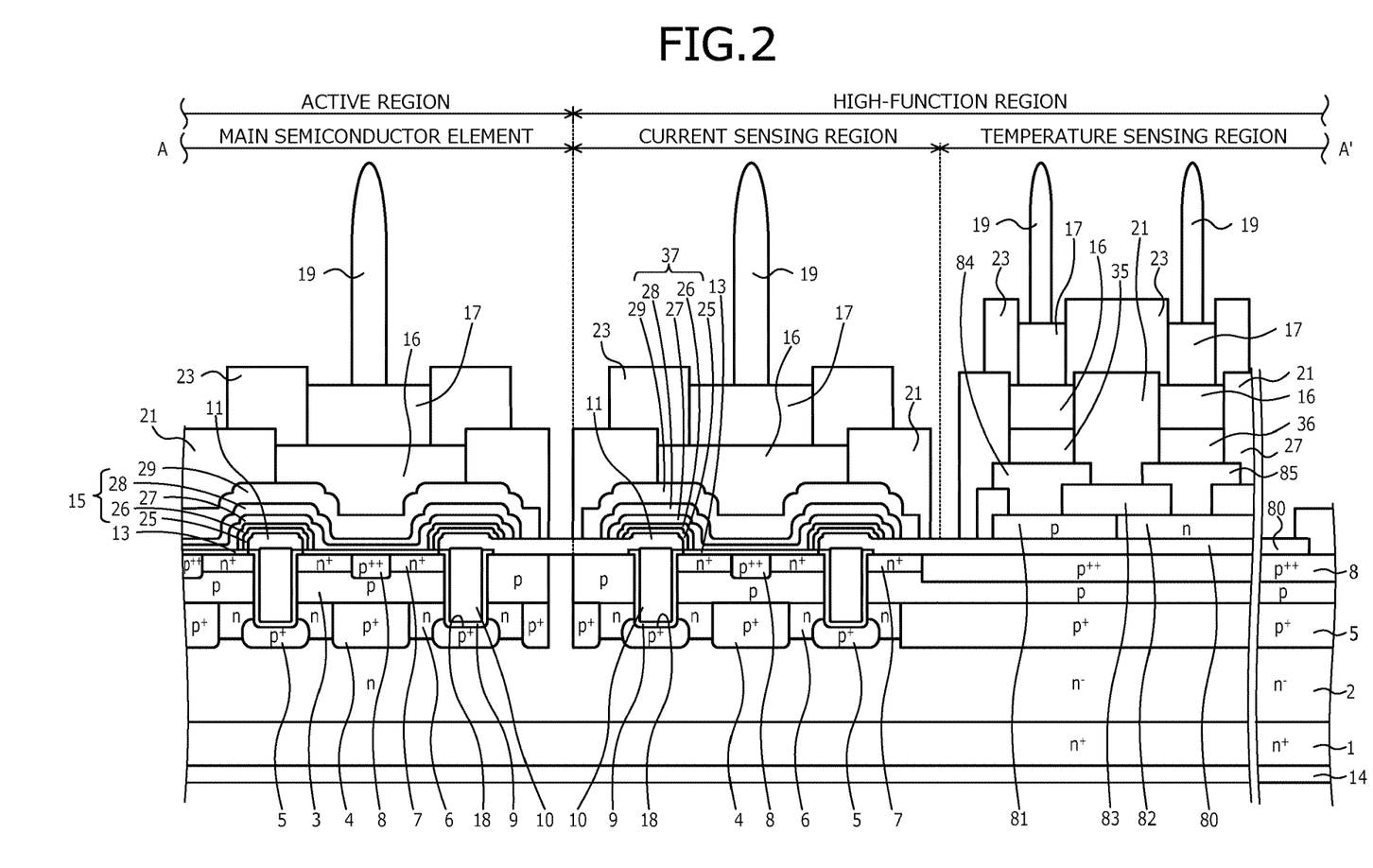
FIG. 2 is a cross-sectional view of the structure of a portion of the silicon carbide semiconductor device according to the embodiment along cutting line A-A' in FIG. 1.

FIG. 2 is a cross-sectional view of the structure of a portion of the silicon carbide semiconductor device according to the embodiment along cutting line A-A' in FIG. 1. FIG. 2 depicts a cross-section of the structure along cutting line A-A' in FIG. 1, from a portion of the effective region 1*a* of the active region 40, through portions (source electrode pad of the effective region 1*a* of the active region 40, the OC pad 37, the cathode electrode pad 36, and the anode electrode pad 35 of the high-function region 3*a* of the active region 40) of the high-function region 3*a*. Further, only two adjacent unit cells of the main semiconductor element 15*a* are depicted while other unit cells of the main semiconductor element 15*a*, adjacent to the depicted unit cells and closer to a center of the chip (semiconductor substrate) are not depicted. In FIG. 2, a cross-section of the main semiconductor element 15*a* and the current sensing region 37*a* cut along an x axis is depicted and a cross-section of the temperature sensing region 35*a* cut along a y axis is depicted.

As depicted in FIG. 2, in the main semiconductor element 15*a* of the silicon carbide semiconductor device according to the embodiment, an n-type silicon carbide epitaxial layer (first semiconductor layer of a first conductivity type) 2 is deposited on a first main surface (front surface), for example, a (0001) plane (Si-face), of an n$^+$-type silicon carbide substrate (semiconductor substrate of the first conductivity type) 1.

The n$^+$-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen at an impurity concentration lower than an impurity concentration of the n$^+$-type silicon carbide substrate 1. At a first surface of the n-type silicon carbide epitaxial layer 2, opposite a second surface thereof facing the n$^+$-type silicon carbide substrate 1, n-type high-concentration regions 6 are formed. The n-type high-concentration regions 6 have an impurity concentration lower than the impurity concentration of the n$^+$-type silicon carbide substrate 1 and higher than the impurity concentration of the n-type silicon carbide epitaxial layer 2, and are a high-concentration n-type drift layer doped with, for example, nitrogen. On a first main surface side of the n-type silicon carbide epitaxial layer 2, a p-type silicon carbide epitaxial layer 3 is provided. Hereinafter, the n$^+$-type silicon carbide substrate 1, the n-type silicon carbide epitaxial layer 2, and the p-type silicon carbide epitaxial layer (second semiconductor layer of a second conductivity type) 3 collectively are regarded as a silicon carbide semiconductor base.

As depicted in FIG. 2, a back electrode (second electrode) 14 is provided on a second main surface (back surface, i.e., back surface of the silicon carbide semiconductor base) of the n$^+$-type silicon carbide substrate 1. The back electrode 14 configures a drain electrode. On a surface of the back electrode 14, a drain electrode pad (not depicted) is provided.

In the silicon carbide semiconductor base, at a first main surface thereof (surface of the p-type silicon carbide epitaxial layer 3), a stripe-shaped trench structure is formed. In particular, trenches 18 penetrate the p-type silicon carbide epitaxial layer 3 from a first surface of the p-type silicon carbide epitaxial layer 3 (the first main surface of the silicon carbide semiconductor base) opposite a second surface of the p-type silicon carbide epitaxial layer 3 facing the n$^+$-type silicon carbide substrate 1, and reach the n-type high-concentration regions 6. Along inner walls of the trenches 18, a gate insulating film 9 is formed on bottoms and sidewalls of the trenches 18, and stripe-shaped gate electrodes 10 are formed on the gate insulating film 9 in the trenches 18, respectively. The gate insulating film 9 insulates the gate electrodes 10 from the n-type high-concentration regions 6 and the p-type silicon carbide epitaxial layer 3. A portion of each of the gate electrodes 10 protrudes from a top (side closest to the source electrode pad 15) of the trenches 18, toward the source electrode pad 15.

In a surface layer of each of the n-type high-concentration regions 6 on a first side (side closest to the first main surface of the silicon carbide semiconductor base) thereof opposite a second side thereof facing the n$^+$-type silicon carbide substrate 1, first p$^+$-type base regions 4 are selectively provided. Second p$^+$-type base regions 5 are formed beneath the trenches 18, respectively, the second p$^+$-type base regions 5 each having a width wider than a width of the trenches 18. The first p$^+$-type base regions 4 and the second p$^+$-type base regions 5, for example, are doped with aluminum.

Portions of the first p$^+$-type base regions 4 may partially extend toward the trenches 18 to be connected with the second p$^+$-type base regions 5. In this instance, the portions of the first p$^+$-type base regions 4 may be disposed to repeatedly alternate, in a plan view, the n-type high-concentration regions 6 along a direction (hereinafter, second direction) y orthogonal to a direction (hereinafter, first direction) x along which the first p$^+$-type base regions 4 and the second p$^+$-type base regions 5 are arranged. For example, a structure in which the portions of the first p$^+$-type base regions 4 extend toward both of the trenches 18 adjacent thereto along the first direction x to be connected with portions of the second p$^+$-type base regions 5 may be periodically disposed along the second direction y. A reason for this is that holes generated during avalanche breakdown at junctions between the second p$^+$-type base regions 5 and the n-type silicon carbide epitaxial layer 2 are efficiently migrated to source electrodes (first electrodes) 13, whereby the load to the gate insulating film 9 is reduced, thereby increasing reliability.

In the p-type silicon carbide epitaxial layer 3, at the first main surface of the silicon carbide semiconductor base, n$^+$-type source regions (first semiconductor regions of the first conductivity type) 7 and p$^{++}$-type contact regions (second semiconductor regions of the second conductivity type) 8 are selectively provided. The n$^+$-type source regions 7 are in contact with the trenches 18. Further, the n$^+$-type source regions 7 and the p$^{++}$-type contact regions 8 are in contact with one another. Further, in regions sandwiched between the first p$^+$-type base regions 4 and the second p$^+$-type base regions 5 of the surface layer of the n-type silicon carbide epitaxial layer 2 on the first side of the n-type silicon carbide epitaxial layer 2 closest to the first main surface of the silicon carbide semiconductor base and in regions sandwiched between the p-type silicon carbide epitaxial layer 3 and the second p$^+$-type base regions 5, the n-type high-concentration regions 6 are provided.

An interlayer insulating film 11 is provided on an entire area of the first main surface of the silicon carbide semiconductor base so as to cover the gate electrodes 10 embedded in the trenches 18. The source electrodes 13 are in contact with the n$^+$-type source regions 7 and the p$^{++}$-type contact regions 8 through contact holes opened in the interlayer insulating film 11. The source electrodes 13, for example, are a NiSi film. The contact holes opened in the interlayer insulating film 11 have a stripe-shape corresponding to the shape of the gate electrodes 10. The source electrodes 13 are electrically insulated from the gate electrodes 10 by the interlayer insulating film 11. On the source electrodes 13, the source electrode pad 15 is provided. The source electrode pad 15, for example, is formed by stacking a first TiN film 25, a first Ti film 26, a second TiN film 27, a second Ti film 28, and an Al alloy film 29. Between the source electrodes 13 and the interlayer insulating film 11, for example, a barrier metal (not depicted) that prevents diffusion of metal atoms from the source electrodes 13 to the gate electrodes 10 may be provided.

Plating films 16 are selectively provided on top of the source electrode pad 15 and solder 17 is selectively provided on surfaces of the plating films 16. External terminal electrodes 19 that lead out potential of the source electrodes 13 externally are provided on the solder 17. Each of the external terminal electrodes 19 has a needle-like pin-shape and is bonded in an upright position to the source electrode pad 15.

Portions of the surface of the source electrode pad 15 other than those of the plating films 16 are covered by first protective films 21. In particular, the first protective films 21 are provided so as to cover the source electrode pad 15 and in openings of the first protective films 21, the external terminal electrodes 19 are bonded via the plating films 16 and the solder 17. Borders between the plating films 16 and the first protective films 21 are covered by second protective films 23. The first protective films 21 and the second protective films 23, for example, are polyimide films.

Further, as depicted in FIG. 2, the current sensing region 37*a* of the silicon carbide semiconductor device according to the embodiment, as described above, is a vertical MOSFET having unit cells configured similarly to the unit cells of the main semiconductor element 15*a* and is provided in the high-function region 3*a*.

Further, as depicted in FIG. 2, in the temperature sensing region 35*a* of the silicon carbide semiconductor device according to the embodiment, the n-type silicon carbide epitaxial layer 2 is deposited on the first main surface (front surface), for example, a (0001) plane (Si-face), of the n$^+$-type silicon carbide substrate (semiconductor substrate of the first conductivity type) 1, the second p$^+$-type base regions 5 and the p-type silicon carbide epitaxial layer 3 are provided at the surface of the n-type silicon carbide epitaxial layer 2 closest to the first main surface of the silicon carbide semiconductor base. In the p-type silicon carbide epitaxial layer 3, at the first main surface of the silicon carbide semiconductor base, the p$^{++}$-type contact regions 8 are provided.

Further, a field insulating film 80 is provided on the p$^{++}$-type contact regions 8, and a p-type polysilicon layer 81 and an n-type polysilicon layer 82 are provided on the field insulating film 80. The p-type polysilicon layer 81 and the n-type polysilicon layer 82 are a polysilicon diode formed by a pn junction thereof. Instead of the p-type polysilicon layer 81 and the n-type polysilicon layer 82, a diffusion diode formed by pn junctions between p-type diffusion regions and n-type diffusion regions may be used as the temperature sensing region 35*a*. In this instance, for example, in n-type separation regions (not depicted) selectively formed in the second p$^+$-type base regions 5, p-type diffusion regions and n-type diffusion regions configuring the diffusion diode may each be selectively formed.

The anode electrode pad 35 is electrically connected to the p-type polysilicon layer 81 through an anode electrode 84. The cathode electrode pad 36 is electrically connected to the n-type polysilicon layer 82 through a cathode electrode 85. The external terminal electrodes 19 are bonded to the anode electrode pad 35 and the cathode electrode pad 36 via the plating films 16 and the solder 17, similarly to the source electrode pad 15 of the main semiconductor element 15*a*, and the anode electrode pad 35 and the cathode electrode pad 36 are protected by the first protective films 21 and the second protective films 23.

Figure 3A:
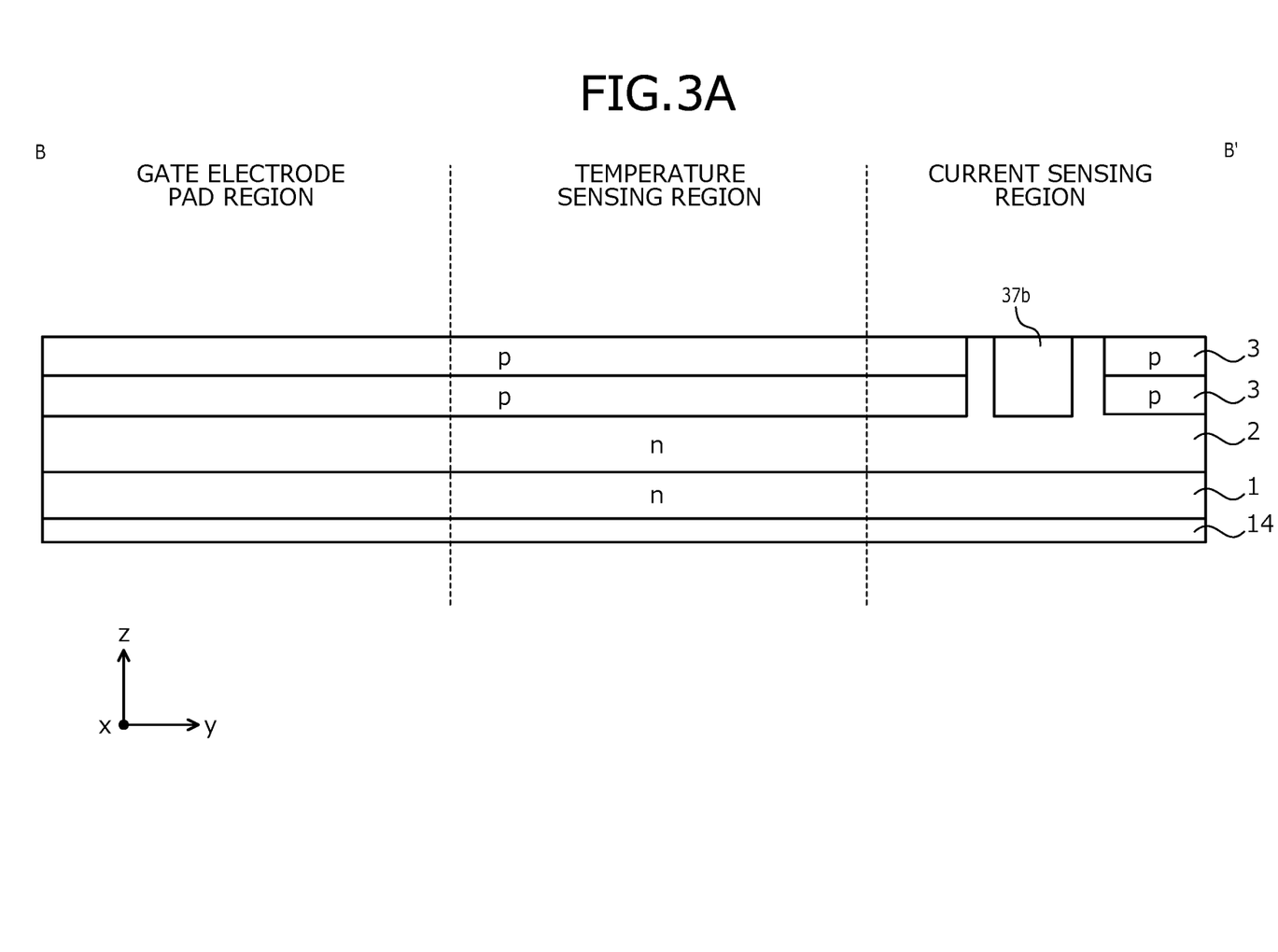
FIG. 3A is a cross-sectional view of the structure of the silicon carbide semiconductor device according to the embodiment along cutting line B-B' in FIG. 1.
Figure 3B:
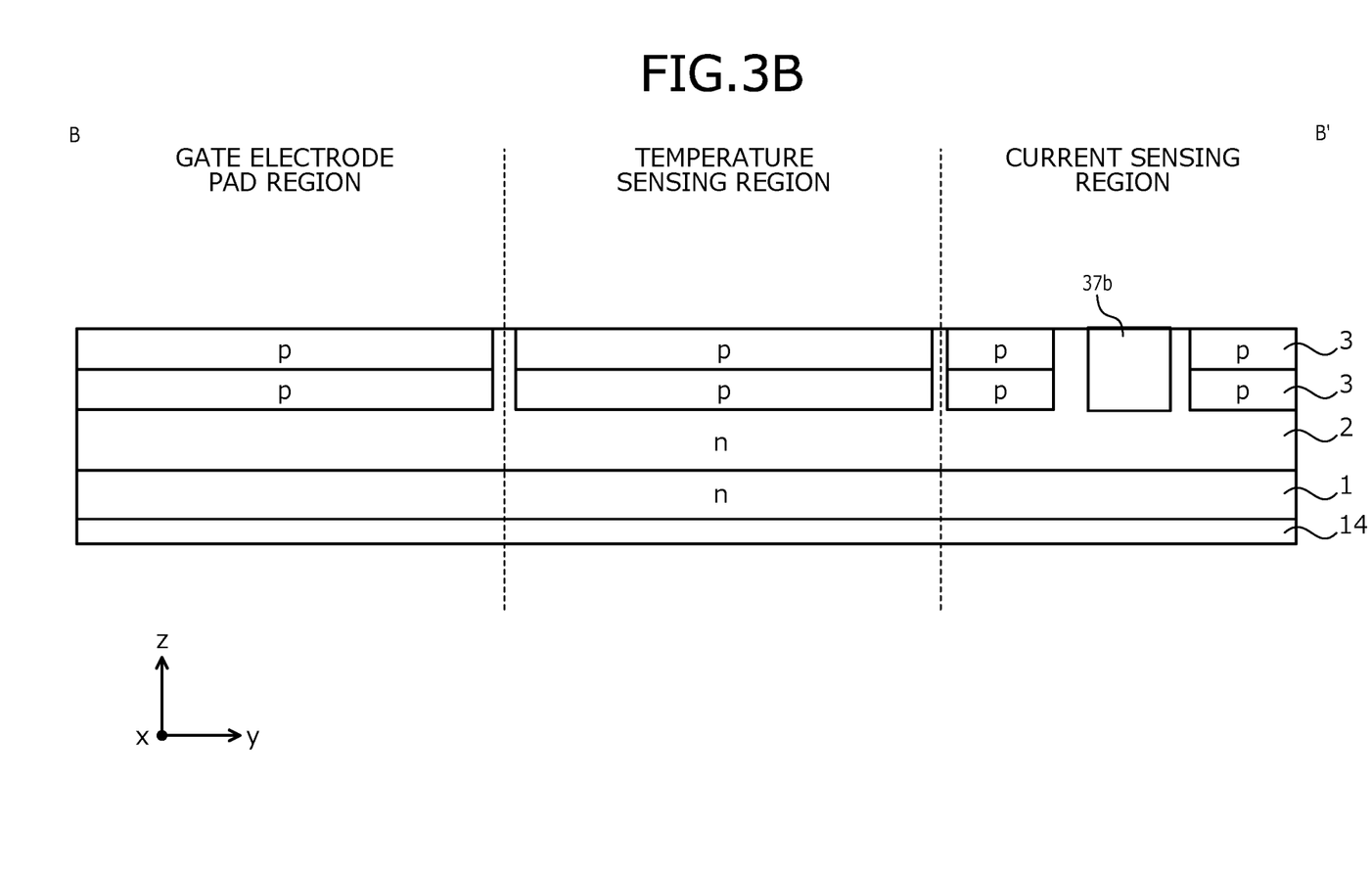
FIG. 3B is a cross-sectional view of another structure of the silicon carbide semiconductor device according to the embodiment along cutting line B-B' in FIG. 1.

FIG. 3A is a cross-sectional view of the structure of the silicon carbide semiconductor device according to the embodiment along cutting line B-B' in FIG. 1. Further, FIG. 3B is a cross-sectional view of another structure of the silicon carbide semiconductor device according to the embodiment along cutting line B-B' in FIG. 1. In FIGS. 3A and 3B, the structure above (positive direction along z axis) the p-type silicon carbide epitaxial layers 3 is not depicted. As depicted in FIGS. 3A and 3B, in the gate electrode pad region 22*a*, the temperature sensing region 35*a*, and the current sensing region 37*a*, the p-type silicon carbide epitaxial layers 3 are provided in the n-type silicon carbide epitaxial layer 2. The p-type silicon carbide epitaxial layers 3 of the gate electrode pad region 22*a*, the temperature sensing region 35*a*, and the current sensing region 37*a* are common with the p-type silicon carbide epitaxial layers 3 of the main semiconductor element 15*a*, and in the current sensing region 37*a*, an active region 37*b* of the current sensing region is provided between the p-type silicon carbide epitaxial layers 3.

Further, as depicted in FIG. 3A, the temperature sensing region 35*a* may be continuous with the p-type silicon carbide epitaxial layers 3 of the main semiconductor element 15*a* or as depicted in FIG. 3B, may be separate from the p-type silicon carbide epitaxial layers 3 of the main semiconductor element 15*a* by a predetermined distance. Similarly, the current sensing region 37*a* may also be continuous with the p-type silicon carbide epitaxial layers 3 of the temperature sensing region 35*a* or may be separated by a predetermined distance. As depicted in FIGS. 3A and 3B, the n$^+$-type source regions 7, etc. are not disposed in the temperature sensing region 35*a* or the gate electrode pad region 22*a* included in the high-function region 3*a*. Thus, in the high-function region 3*a*, an arithmetic area of p-type regions is greater than that of other portions of the active region 40. Therefore, the effective arithmetic area of the built-in diode is large.

Figure 4:
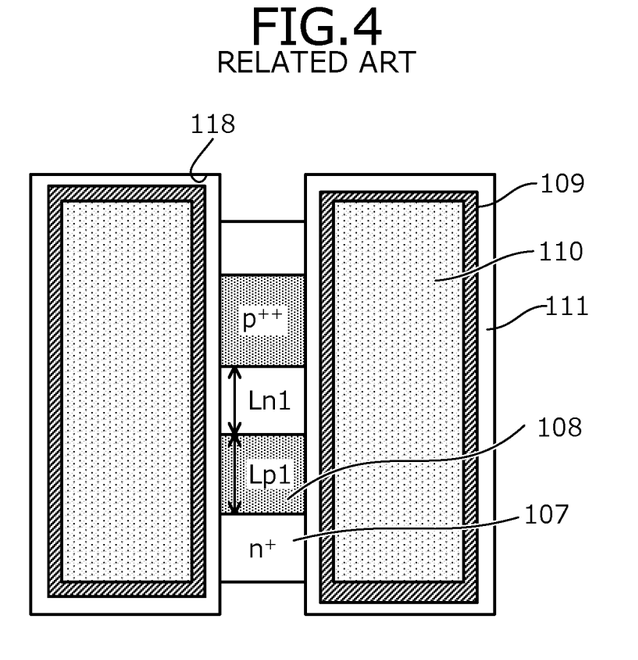
FIG. 4 is a top view of a structure of a conventional silicon carbide semiconductor device, between trenches.

FIG. 4 is a top view of a structure of a conventional silicon carbide semiconductor device, between trenches. In the conventional silicon carbide semiconductor device, n$^+$-type source regions 107 and p$^{++}$-type contact regions 108 are provided between trenches 118, alternating one another along a length direction of the trenches 118. In FIG. 4, reference numerals 109, 110, 111 are gate insulating films, gate electrodes, and interlayer insulating film, respectively. Further, in the conventional silicon carbide semiconductor device, the structure between the trenches 118 of a current sensing region is similar to the structure between the trenches 118 of an active region.

Therefore, in the conventional silicon carbide semiconductor device, a length Ln1 of the n$^+$-type source regions 107 (in the length direction thereof) of the current sensing region is equal to the length Ln1 of the n$^+$-type source regions 107 (in the length direction thereof) of the active region, a length Lp1 of the p$^{++}$-type contact regions 108 of the current sensing region is equal to the length Lp1 of the p$^{++}$-type contact regions 108 of the active region. In other words, an arithmetic area of the surfaces of the p$^{++}$-type contact regions 108 of the current sensing region is equal to an arithmetic area of the surfaces of the p$^{++}$-type contact regions 108 of the active region and an arithmetic area of the surfaces of the n$^+$-type source regions 107 of the current sensing region are equal to an arithmetic area of the surfaces of the n$^+$-type source regions 107 of the active region.

Figure 5:
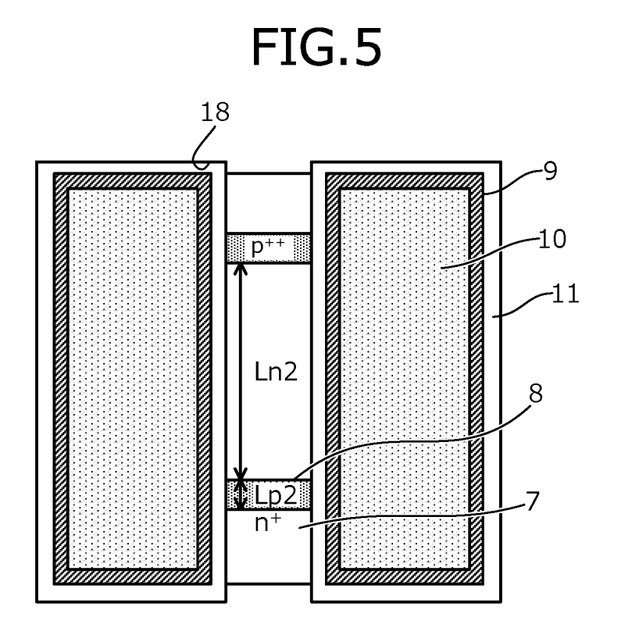
FIG. 5 is a top view of the structure of the silicon carbide semiconductor device according to the embodiment, between trenches of a current sensing region.

FIG. 5 is a top view of the structure of the silicon carbide semiconductor device according to the embodiment, between the trenches of the current sensing region. The structure between the trenches 18 of the active region 40 of the silicon carbide semiconductor device according to the embodiment is similar to that of the conventional silicon carbide semiconductor device depicted in FIG. 4 and therefore, is not depicted. Further, in the description hereinafter, in the silicon carbide semiconductor device according to the embodiment, a length of the n$^+$-type source regions 7 between the trenches 18 of the active region 40 is indicated as Ln1, a length of the p$^{++}$-type contact regions 8 is indicated as Lp1, a length of the n$^+$-type source regions 7 between the trenches 18 of the current sensing region 37a is indicated as Ln2, and a length of the p$^{++}$-type contact regions 8 as indicated as Lp2.

In the silicon carbide semiconductor device according to the embodiment as well, the n$^+$-type source regions 7 and the p$^{++}$-type contact regions 8 are provided between the trenches 18, alternating one another along a length direction of the trenches 18. In an instance in which the p$^{++}$-type contact regions 8 are not provided, the n$^+$-type source regions 7 and the p-type silicon carbide epitaxial layers 3 are provided between the trenches 18, alternating one another along the length direction of the trenches 18. In this instance, the length, arithmetic area, etc. of the p$^{++}$-type contact regions 8 hereinafter are the length, the arithmetic area, etc. of the p-type silicon carbide epitaxial layers 3.

In the silicon carbide semiconductor device according to the embodiment, the arithmetic area of the surfaces of the p$^{++}$-type contact regions 8 of the current sensing region 37a is less than the arithmetic area of the surfaces of the p$^{++}$-type contact regions 8 of the active region 40. For example, without changing Ln1, Lp1 in the active region 40, Ln2 is increased and Lp2 is decreased in the current sensing region 37a, whereby the arithmetic area of the surfaces of the p$^{++}$-type contact regions 8 of the current sensing region 37a may be reduced. In the active region 40, Lp1/Ln1=about 1 whereas in the current sensing region 37a, Ln2/Lp2>1 is assumed. To sufficiently increase forward voltage (Vf) of the built-in diode, Ln2/Lp2>at least 2, i.e., the arithmetic area of the surfaces of the n$^+$-type source regions 7 of the current sensing region 37a may be at least two times the arithmetic area of the surfaces of the p$^{++}$-type contact regions 8 of the current sensing region 37a.

The surfaces of the p$^{++}$-type contact regions 8 are faces of the p$^{++}$-type contact regions 8, opposite faces thereof facing the n$^+$-type silicon carbide substrate 1, the surfaces of the n$^+$-type source regions 7 are faces of the n$^+$-type source regions 7, opposite faces thereof facing the n$^+$-type silicon carbide substrate 1.

In this manner, a ratio of p-type regions and n-type regions of regions between the trenches 18 of the current sensing region 37a is set so that the n-type regions are greater, whereby the arithmetic area of a region used as the built-in diode decreases and the forward voltage (Vf) of the built-in diode of the current sensing region 37a increases. As a result, concentration of carriers during reverse recovery at the time of switching may be mitigated. Further, impurity concentrations or depths of the p-type regions and the n-type regions of regions between the trenches 18 of the current sensing region 37a are changed, whereby the forward voltage of the built-in diode of the current sensing region 37a may also be increased. However, in this instance, in the current sensing region 37a and the main semiconductor element 15a, element characteristics change. Furthermore, the method of manufacturing the current sensing region 37a and the main semiconductor element 15a has to be changed. On the other hand, modification of the arithmetic areas of the p-type regions and the n-type regions of the embodiment is merely a modification of a mask pattern and may be performed by existing manufacturing processes.

Figure 6:
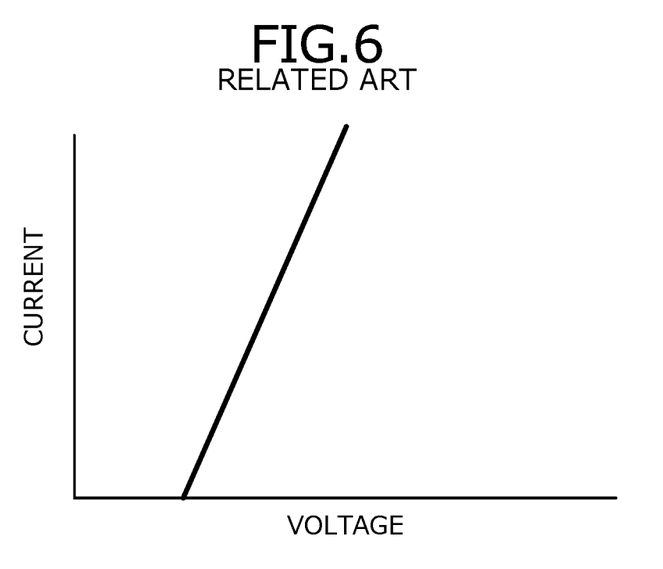
FIG. 6 is a graph depicting a characteristics diagram of the conventional silicon carbide semiconductor device.
Figure 7:
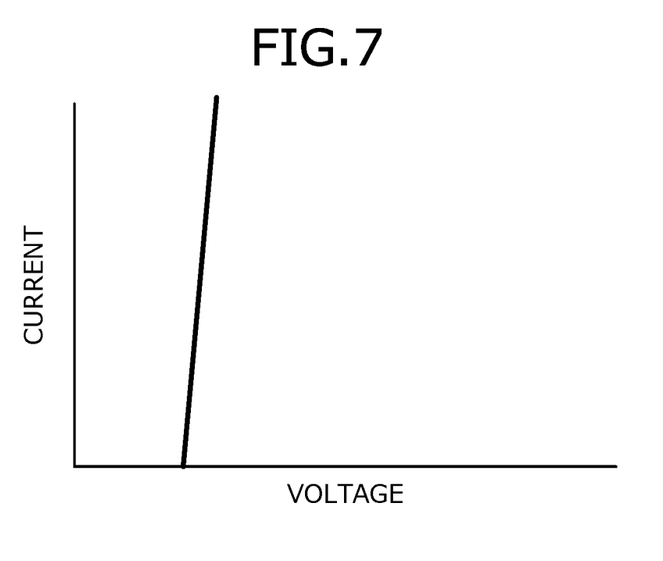
FIG. 7 is a graph depicting a characteristics diagram of the silicon carbide semiconductor device according to the embodiment.

FIG. 6 is a graph depicting a characteristics diagram of the conventional silicon carbide semiconductor device. Further, FIG. 7 is a graph depicting a characteristics diagram of the silicon carbide semiconductor device according to the embodiment. In each of the graphs, characteristics of drain current ($I_D$)-voltage between gate and source ($V_{GS}$) are depicted, where a horizontal axis indicated $V_{GS}$ in units of V and a vertical axis indicates $I_D$ in units of A. In comparing FIG. 6 and FIG. 7, it is found that in the embodiment, the increase of $I_D$ is large (slope is large) with respect to the increase of $V_{GS}$ and the forward voltage Vf is high.

Next, a method of manufacturing the silicon carbide semiconductor device according to the embodiment will be described. FIGS. 8, 9, 10, 11, 12, 13, and 14 are cross-sectional views of states of the silicon carbide semiconductor device according to the embodiment during manufacture.

Figure 8:
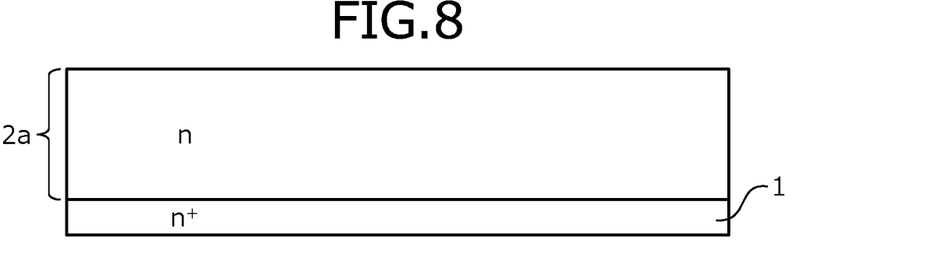
FIG. 8 is a cross-sectional view of a state of the silicon carbide semiconductor device according to the embodiment during manufacture.

First, the n$^+$-type silicon carbide substrate 1 containing an n-type silicon carbide is prepared. Subsequently, on the first main surface of the n$^+$-type silicon carbide substrate 1, a first n-type silicon carbide epitaxial layer 2a containing silicon carbide is epitaxial grown to have a thickness of, for example, about 30 µm while an n-type impurity, for example, nitrogen atoms, is doped. The first n-type silicon carbide epitaxial layer 2a becomes the n-type silicon carbide epitaxial layer 2. The state up to here is depicted in FIG. 8.

Figure 9:
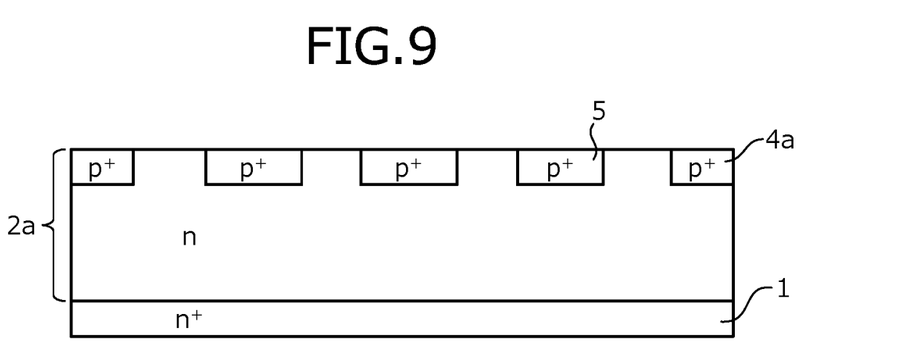
FIG. 9 is a cross-sectional view of a state of the silicon carbide semiconductor device according to the embodiment during manufacture.

Next, on the surface of the first n-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 4a of a depth of about 0.5 µm. Concurrently with the lower first p$^+$-type base regions 4a, the second p$^+$-type base regions 5 that become the bottoms of the trenches 18 may be formed. Formation is such that a distance between one of the lower first p$^+$-type base regions 4a and one of the second p$^+$-type base regions 5 adjacent thereto is about 1.5 µm. An impurity concentration of the lower first p$^+$-type base regions 4a and the second p$^+$-type base regions 5 is set to be, for example, about 5×10$^{18}$/cm$^3$. The state up to here is depicted in FIG. 9.

Next, portions of the ion implantation mask are removed, an n-type impurity such as nitrogen is implanted in the openings to form, in portions of a surface region of the first n-type silicon carbide epitaxial layer 2a, lower n-type high-concentration regions 6a of a depth of, for example, about 0.5 µm. An impurity concentration of the lower n-type high-concentration regions 6a is set to be, for example, about 1×10$^{17}$/cm$^3$.

Next, on the surface of the first n-type silicon carbide epitaxial layer 2a, a second n-type silicon carbide epitaxial layer 2b doped with an n-type impurity such as nitrogen is formed to have thickness of about 0.5 µm. An impurity concentration of the second n-type silicon carbide epitaxial layer 2b is set to become about 3×10$^{15}$/cm$^3$. Hereinafter, the first n-type silicon carbide epitaxial layer 2a and the second n-type silicon carbide epitaxial layer 2b collectively form the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film to form upper first $p^+$-type base regions 4b of a depth of about 0.5 μm, so as to overlap the lower first $p^+$-type base regions 4a. The lower first $p^+$-type base regions 4a and the upper first $p^+$-type base regions 4b form continuous regions to become the first $p^+$-type base regions 4. An impurity concentration of the upper first $p^+$-type base regions 4b is set to become, for example, about $5\times10^{18}/cm^3$.

Figure 10:
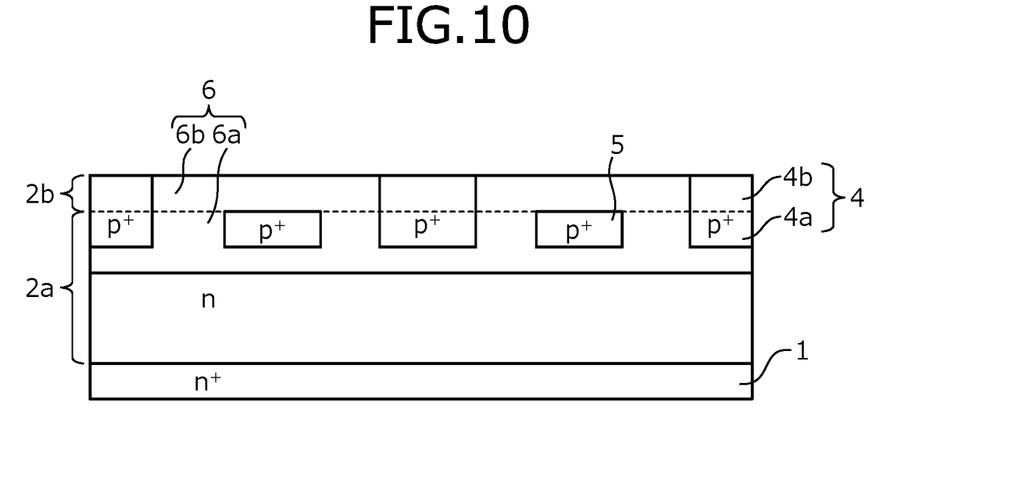
FIG. 10 is a cross-sectional view of a state of the silicon carbide semiconductor device according to the embodiment during manufacture.

Next, portions of the ion implantation mask are removed, an n-type impurity such as nitrogen is implanted in the openings to form, in portions of a surface region of the second n-type silicon carbide epitaxial layer 2b, upper n-type high-concentration regions 6b of a depth of, for example, about 0.5 μm. An impurity concentration of the upper n-type high-concentration regions 6b is set to be, for example, about $1\times10^{17}/cm^3$. The upper n-type high-concentration regions 6b and the lower n-type high-concentration regions 6a are formed to at least partially contact one another and form the n-type high-concentration regions 6. However, in some instances, the n-type high-concentration regions 6 may be formed on an entire area of the substrate surface or may not be formed. The state up to here is depicted in FIG. 10.

Figure 11:
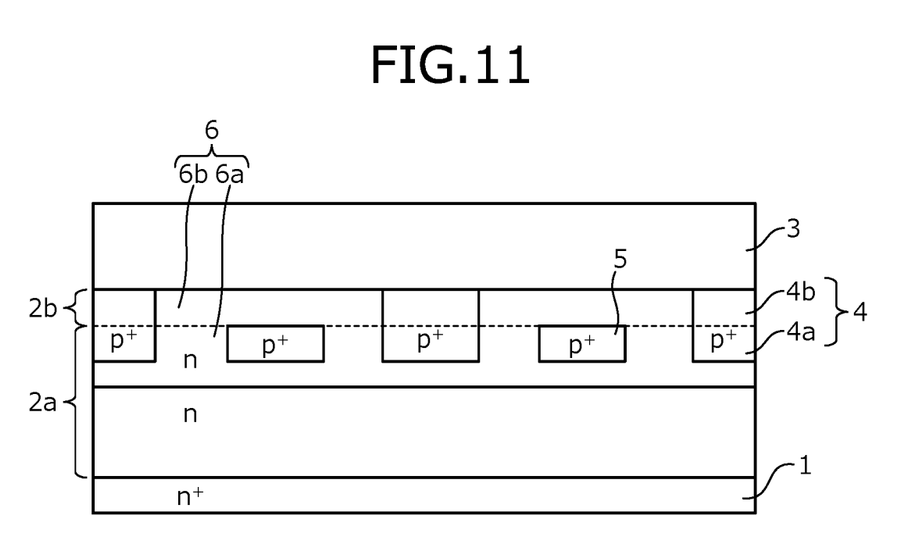
FIG. 11 is a cross-sectional view of a state of the silicon carbide semiconductor device according to the embodiment during manufacture.

Next, on the surface of the n-type silicon carbide epitaxial layer 2, the p-type silicon carbide epitaxial layer 3 doped with a p-type impurity such as aluminum is formed to have a thickness of about 1.3 μm. An impurity concentration of the p-type silicon carbide epitaxial layer 3 is set to be about $4\times10^{17}/cm^3$. The state up to here is depicted in FIG. 11.

Next, on the surface of the p-type silicon carbide epitaxial layer 3, an ion implantation mask having predetermined openings is formed by photolithography using, for example, an oxide film. An n-type impurity such as phosphorus (P) is implanted in the openings to form the $n^+$-type source regions 7 at portions of the surface of the p-type silicon carbide epitaxial layer 3. An impurity concentration of the $n^+$-type source regions 7 is set to be higher than the impurity concentration of the p-type silicon carbide epitaxial layer 3. Next, the ion implantation mask used to form the $n^+$-type source regions 7 is removed and by a similar method, an ion implantation mask having predetermined openings is formed, a p-type impurity such as aluminum is implanted in portions of the surface of the p-type silicon carbide epitaxial layer 3, whereby the $p^{++}$-type contact regions 8 are provided. An impurity concentration of the $p^{++}$-type contact regions 8 is set to be higher than the impurity concentration of the p-type silicon carbide epitaxial layer 3.

Figure 12:
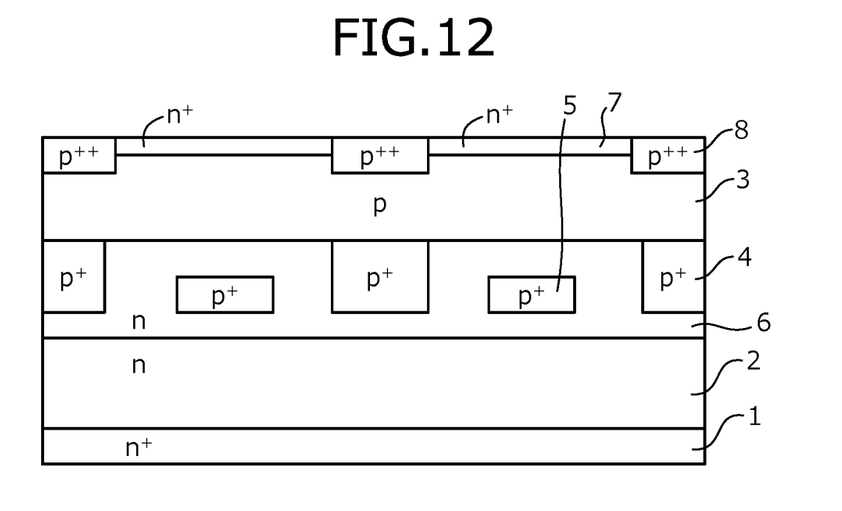
FIG. 12 is a cross-sectional view of a state of the silicon carbide semiconductor device according to the embodiment during manufacture.

Here, when the $n^+$-type source regions 7 and the $p^{++}$-type contact regions 8 are formed, for example, the arithmetic area of the $p^{++}$-type contact regions 8 of the current sensing region 37a is reduced, whereby the arithmetic area of the $p^{++}$-type contact regions 8 between the trenches 18 of the current sensing region 37a is smaller than the arithmetic area of the $p^{++}$-type contact regions 8 between the trenches 18 of the active region 40. The state up to here is depicted in FIG. 12.

Next, a heat treatment (annealing) is performed under an inert gas atmosphere at a temperature of about 1700 degrees C., thereby implementing an activation treatment for the first $p^+$-type base regions 4, the second $p^+$-type base regions 5, the $n^+$-type source regions 7, and the $p^{++}$-type contact regions 8. As described, ion implanted regions may be activated by a single session of the heat treatment or may be activated by performing the heat treatment each time ion implantation is performed.

Figure 13:
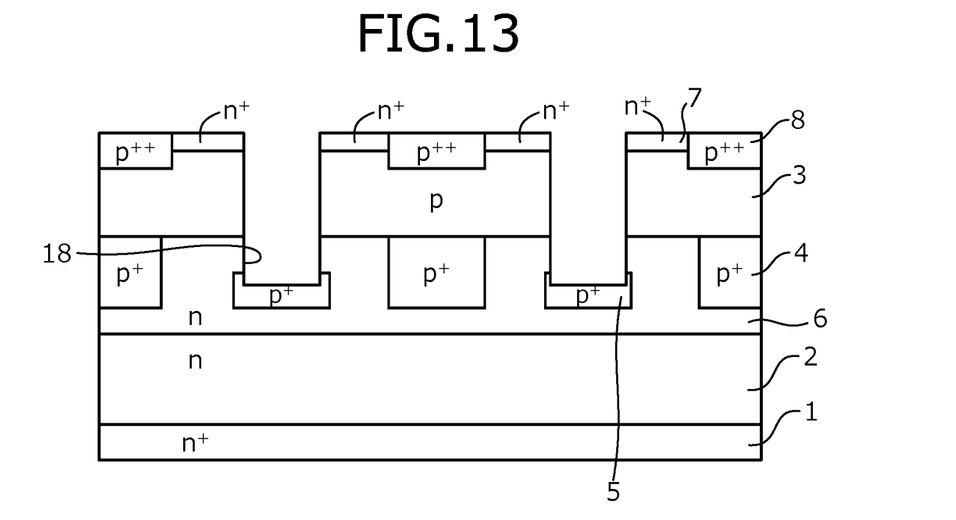
FIG. 13 is a cross-sectional view of a state of the silicon carbide semiconductor device according to the embodiment during manufacture.

Next, on the surface of the p-type silicon carbide epitaxial layer 3, a trench formation mask having predetermined openings is formed by photolithography using, for example, an oxide film. Next, by dry etching, the trenches 18 that penetrate the p-type silicon carbide epitaxial layer 3 and reach the n-type high-concentration regions 6 are formed. The bottoms of the trenches 18 may reach the second $p^+$-type base regions 5 formed in the n-type high-concentration regions 6. Next, the trench formation mask is removed. The state up to here is depicted in FIG. 13.

Next, along the surfaces of the $n^+$-type source regions 7 and along the bottoms and sidewalls of the trenches 18, the gate insulating film 9 is formed. The gate insulating film 9 may be formed by thermal oxidation at a temperature of about 1000 degrees C. under an oxygen atmosphere. Further, the gate insulating film 9 may be formed by a deposition method by a chemical reaction such as that for a high temperature oxide (HTO).

Next, on the gate insulating film 9, for example, a polycrystalline silicon layer doped with phosphorus atoms is provided. The polycrystalline silicon layer may be formed so as to be embedded in the trenches 18. The polycrystalline silicon layer is patterned by photolithography and left in the trenches 18 to, thereby, form the gate electrodes 10.

Figure 14:
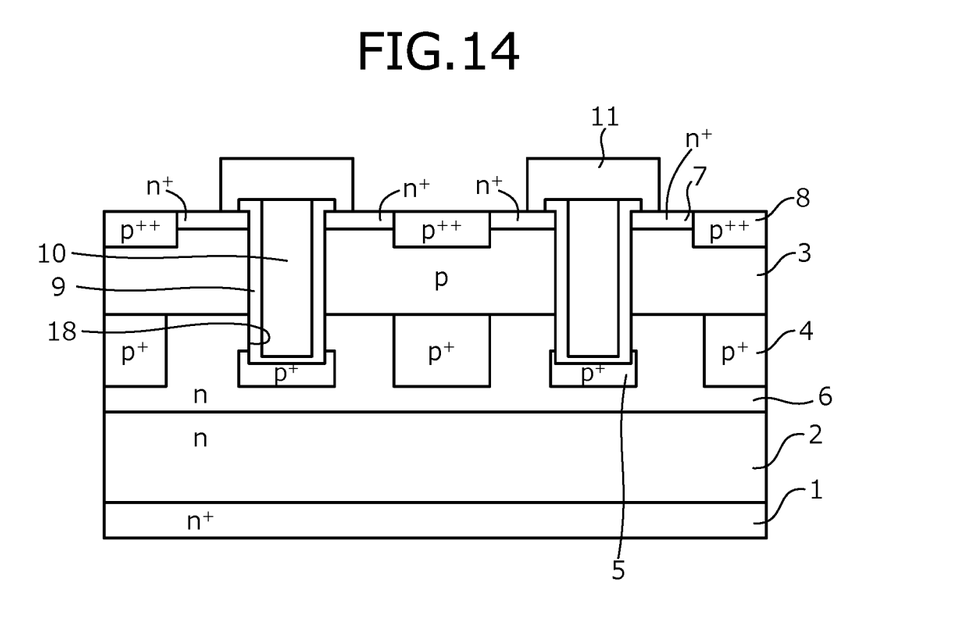
FIG. 14 is a cross-sectional view of a state of the silicon carbide semiconductor device according to the embodiment during manufacture.

Next, for example, a phosphate glass is deposited to have thickness of about 1 μm and so as to cover the gate insulating film 9 and the gate electrodes 10 to thereby form the interlayer insulating film 11. Next, a barrier metal (not depicted) containing titanium (Ti) or titanium nitride (TiN) may be formed so as to cover the interlayer insulating film 11. The interlayer insulating film 11 and the gate insulating film 9 are patterned by photolithography to form contact holes exposing the $n^+$-type source regions 7 and the $p^{++}$-type contact regions 8. Thereafter, a heat treatment (reflow) is performed, thereby planarizing the interlayer insulating film 11. The state up to here is depicted in FIG. 14.

Next, in the contact holes and on the interlayer insulating film 11, a conductive film that forms the source electrodes 13 is provided. The conductive film is selectively removed, leaving the source electrodes 13 only in the contact holes; the $n^+$-type source regions 7 and the $p^{++}$-type contact regions 8 and the source electrodes 13 being in contact with one another. Next, the source electrodes 13 other than of the contact holes are selectively removed.

Next, for example, by a sputtering technique, an electrode pad that forms the OC pad 37 and the source electrode pad 15 is deposited on the source electrodes 13 of the front surface of the silicon carbide semiconductor base and in the openings of the interlayer insulating film 11. For example, by a sputtering technique, the first TiN film 25, the first Ti film 26, the second TiN film 27, and the second Ti film 28 are stacked, and the Al alloy film 29 is further formed to have a thickness of, for example, about 5 μm. The Al alloy film 29 may be an Al film. The Al alloy film 29 is, for example, an Al—Si film or an Al—Si—Cu film. This conductive film is patterned by photolithography and left in the active region 40 of an entire area of the element, whereby the source electrode pad 15 and the OC pad 37 are formed. A thickness of a portion of the electrode pad on the interlayer insulating film 11 may be, for example, 5 μm. The electrode pad may be formed by, for example, aluminum containing silicon at a ratio of 1% (Al—Si). Next, the OC pad 37 and the source electrode pad 15 are selectively removed.

Next, a polyimide film is formed so as to cover the OC pad 37 and the source electrode pad 15. Next, the polyimide film is selectively removed by photolithography and etching to form the first protective films 21 respectively covering the OC pad 37 and the source electrode pad 15, and to form openings in the first protective films 21.

Next, the plating films 16 are selectively formed on the tops of the OC pad 37 and the source electrode pad 15, and the second protective films 23 that cover borders between the plating films 16 and the first protective films 21 are formed. Next, the external terminal electrodes 19 are formed on the plating films 16 via the solder 17.

Next, on the second main surface of the $n^+$-type silicon carbide substrate 1, the back electrode 14 containing nickel, etc. is provided. Thereafter, a heat treatment under an inert gas atmosphere of a temperature of about 1000 degrees C. is performed, thereby forming the back electrode 14 to be in ohmic contact with the $n^+$-type source regions 7, the $p^{++}$-type contact regions 8, and the $n^+$-type silicon carbide substrate 1.

The current sensing region 37a and the main semiconductor element 15a of the active region 40 have similar structures and therefore, are concurrently formed as described above. The temperature sensing region 35a is formed as follows. Before formation of the electrode pad, in the temperature sensing region 35a, on the field insulating film 80, the p-type polysilicon layer 81, the n-type polysilicon layer 82, an interlayer insulating film 83, the anode electrode 84, and the cathode electrode 85 are formed by a general method.

Further, the p-type polysilicon layer 81 and the n-type polysilicon layer 82 of the temperature sensing region 35a, for example, may be formed concurrently with the gate electrodes 10 of the current sensing region 37a and the main semiconductor element 15a. The field insulating film 80 may be a portion of the interlayer insulating film 11 of the current sensing region 37a and the main semiconductor element 15a. In this instance, the p-type polysilicon layer 81 and the n-type polysilicon layer 82 of the temperature sensing region 35a are formed after the interlayer insulating film 11 of the current sensing region 37a and the main semiconductor element 15a.

Next, the anode electrode pad 35 and the cathode electrode pad 36 are formed in contact with the anode electrode 84 and the cathode electrode 85, respectively. The anode electrode pad 35 and the cathode electrode pad 36 may be formed together with the source electrode pad 15 and may have a stacked structure similar to that of the source electrode pad 15.

Next, a polyimide film is formed so as to cover the anode electrode pad 35 and the cathode electrode pad 36. Next, the polyimide film is selectively removed by photolithography and etching to form the first protective films 21 covering the anode electrode pad 35 and the cathode electrode pad 36, respectively, and to further form openings in the first protective films 21.

Next, the plating films 16 are selectively formed on tops of the anode electrode pad 35 and the cathode electrode pad 36, and the second protective films 23 are formed covering borders between the plating films 16 and the first protective films 21. Next, the external terminal electrodes 19 are formed on the plating films 16 via the solder 17, whereby the silicon carbide semiconductor device depicted in FIGS. 1 to 3B is completed.

As described above, according to the silicon carbide semiconductor device according to the embodiment, the arithmetic area of the $p^{++}$-type contact regions of the current sensing region is smaller than the arithmetic area of the $p^{++}$-type contact regions of the active region. As a result, the ratio of the p-type regions and the n-type regions of regions between the trenches of the current sensing region is greater for the n-type regions and the forward voltage (Vf) of the built-in diode increases. Therefore, the concentration of carriers in reverse recovery during switching may be mitigated and destruction of the current sensing region may be prevented, thereby enabling a semiconductor element having high reliability to be provided.

In the foregoing, while the invention is described taking as an example, an instance in which a MOS is configured on a main surface of a silicon carbide substrate containing silicon carbide and having as the main surface, a (0001) plane, without limitation hereto, the wide bandgap semiconductor, the orientation of the substrate main surface, etc. may be variously changed.

Further, in the embodiments of the present invention, while a trench-type MOSFET is described as an example, without limitation hereto, application is possible to semiconductor devices of various types of configurations such as MOS-type semiconductor devices like IGBTs, planar-type MOSFETs, etc. Further, in the described embodiments, while an instance in which silicon carbide is used as a wide bandgap semiconductor is described as an example, in an instance in which a wide bandgap semiconductor other than silicon carbide such as gallium nitride (GaN) is used, similar effects are obtained. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, in the current sensing region, the arithmetic area of the surface of the second semiconductor layer of the second conductivity type or that of the surfaces of the second semiconductor regions of the second conductivity type is less than the arithmetic area of the surface of the second semiconductor layer of the second conductivity type or that of the surfaces of the second semiconductor regions of the second conductivity type, in the active region. As a result, the ratio of the p-type regions and the n-type regions of regions between the trenches of the current sensing region is such that the n-type regions are greater, whereby the forward voltage (Vf) of the built-in diode increases. Therefore, the concentration of carriers in reverse recovery during switching may be mitigated and destruction of the current sensing region may be prevented, thereby enabling a semiconductor element having high reliability to be provided.

The semiconductor device and the method of manufacturing a semiconductor device achieve an effect in that destruction of the current sensing region may be prevented during reverse recovery of the built-in diode.

As described above, the semiconductor device and the method of manufacturing a semiconductor device according to the present invention are useful for high-voltage semiconductor devices used in power converting equipment and in power source devices such as in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region through which a main current flows and a current detecting region, the semiconductor device comprising:
   a metal oxide semiconductor (MOS) structure having:
      a semiconductor substrate of a first conductivity type, having opposite front and back surfaces;
      a first semiconductor layer of the first conductivity type, provided on the front surface of the semiconductor substrate and having an impurity concentration lower than an impurity concentration of the semiconductor substrate, the first semiconductor layer having opposite first and second surfaces, the first surface thereof facing the semiconductor substrate;
      a plurality of second semiconductor layers of a second conductivity type, selectively provided on the second surface of the first semiconductor layer, each of the second semiconductor layers having opposite first and second surfaces, the first surface thereof facing the semiconductor substrate;
      a plurality of first semiconductor regions of the first conductivity type, selectively provided in the second semiconductor layers at the second surfaces thereof;
      a plurality of gate insulating films, each having opposite first and second surfaces, the first surface thereof being in contact with one of the second semiconductor layers;
      a plurality of gate electrodes provided on the second surfaces of the gate insulating films;
      a plurality of first electrodes provided on the second surfaces of the second semiconductor layers and surfaces of the first semiconductor regions; and
      a second electrode provided on the back surface of the semiconductor substrate, wherein
   the MOS structure configures the active region and the current detecting region,
   the semiconductor substrate and the first semiconductor layer are in both the active region and the current detecting region, and
   two of the plurality of the second semiconductor layers are respectively formed in the current detecting region and the active region, and are separated from each other by a predetermined distance, an arithmetic area of the second surface of the second semiconductor layer in the current detecting region being smaller than an arithmetic area of the second surface of the second semiconductor layer in the active region.

2. The semiconductor device according to claim 1, wherein
   the arithmetic area of the second surface of the second semiconductor layer in the current detecting region is at most ½ of the arithmetic area of the second surface of the second semiconductor layer in the active region.

3. The semiconductor device according to claim 1, wherein
   the MOS structure further has a plurality of trenches penetrating the first semiconductor regions and the second semiconductor layers, and reaching the first semiconductor layer, and
   the gate electrodes are provided in the trenches via the gate insulating films, respectively.

4. The semiconductor device according to claim 3, wherein
   the MOS structure further has a plurality of second semiconductor regions of the second conductivity type, selectively provided in the second semiconductor layers at the second surfaces thereof, the second semiconductor regions having an impurity concentration higher that an impurity concentration of the second semiconductor layers, and
   the first semiconductor regions and the second semiconductor regions are alternately provided along a length direction of the trenches that is in parallel to the second surfaces of the second semiconductor layers, a length of each of the first semiconductor regions in the current detecting region, along the length direction, being greater than a length of each of the second semiconductor regions in the current detecting region, in the length direction.

5. A method of manufacturing a semiconductor device having a metal oxide semiconductor (MOS) structure in a current detecting region and in an active region thereof, a main current flowing through the active region in an ON state of the semiconductor device, the method comprising:
   preparing a semiconductor substrate of a first conductivity type, having opposite front and back surfaces;
   forming a first semiconductor layer of the first conductivity type on the front surface of the semiconductor substrate, the first semiconductor layer having an impurity concentration lower than an impurity concentration of the semiconductor substrate, the first semiconductor layer having opposite first and second surfaces, the first surface thereof facing the semiconductor substrate;
   selectively forming a plurality of second semiconductor layers of a second conductivity type, on the second surface of the first semiconductor layer, each of the second semiconductor layers having opposite first and second surfaces, the first surface thereof facing the semiconductor substrate;
   selectively forming a plurality of first semiconductor regions of the first conductivity type, respectively in the second semiconductor layers at the second surfaces thereof;
   forming a plurality of gate insulating films each having opposite first and second surfaces, the first surface thereof being in contact with one of the second semiconductor layers;
   forming a plurality of gate electrodes on the second surfaces of the gate insulating films;
   forming a plurality of first electrodes on the second surfaces of the second semiconductor layers and surfaces of the first semiconductor regions; and
   forming a second electrode on the back surface of the semiconductor substrate, wherein
   the semiconductor substrate and the first semiconductor layer are formed in both the current detecting region and the active region, and
   two of the plurality of the second semiconductor layers are respectively formed in the current detecting region and the active region, and are separated from each other by a predetermined distance, an arithmetic area of the second surface of the second semiconductor layer in the current detecting region being smaller than an arithmetic area of the second surface of the second semiconductor layer in the active region.

* * * * *